(12) United States Patent
Berger et al.

(10) Patent No.: US 6,939,445 B2
(45) Date of Patent: Sep. 6, 2005

(54) COATED CUTTING TOOL

(75) Inventors: Mattias Berger, Marjefred (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 17 days.

(21) Appl. No.: 10/848,012

(22) Filed: May 19, 2004

(65) Prior Publication Data

US 2004/0214033 A1 Oct. 28, 2004

Related U.S. Application Data

(62) Division of application No. 10/106,116, filed on Mar. 27, 2002, now Pat. No. 6,770,358.

(30) Foreign Application Priority Data

Mar. 28, 2001 (SE) .............................................. 0101111

(51) Int. Cl.⁷ .............................................. C23C 14/00
(52) U.S. Cl. ............................. 204/192.16; 204/192.12; 204/192.15
(58) Field of Search ...................... 204/192.12, 192.15, 204/192.16

(56) References Cited

U.S. PATENT DOCUMENTS

| | | | |
|---|---|---|---|
| 4,019,873 A | 4/1977 | Reiter | |
| 4,268,582 A | 5/1981 | Hale et al. | |
| 4,343,865 A | 8/1982 | Graham | |
| 4,761,346 A | 8/1988 | Naik | |
| 4,820,392 A | 4/1989 | Moskowitz et al. | |
| 4,835,062 A | 5/1989 | Holleck | |
| 5,573,604 A | 11/1996 | Gerdes | |
| 5,624,725 A | 4/1997 | Nelson et al. | |
| 5,945,214 A | 8/1999 | Ma et al. | |
| 5,952,085 A | 9/1999 | Rickerby et al. | |
| 6,287,711 B1 * | 9/2001 | Nieh et al. .................. | 428/697 |

FOREIGN PATENT DOCUMENTS

| | | |
|---|---|---|
| EP | 0 242 100 | 10/1987 |
| JP | 01028358 | 1/1989 |

OTHER PUBLICATIONS

R. Wiedemann et al., "Tempering Behaviour of TiB₂ Coatings", *Surface Engineering*, 14 4 (1998), pp. 299–304.
C. Mitterer et al., "Sputter Deposition of Ultrahard Coatings Within the System Ti–B–C–N", *Surface and Coatings Technology*, 41 (1990), pp. 351–363.
M. Berger et al., "Evaluation of Magnetron–Sputtered TiB₂ Intended for Tribological Application", *Surface and Coatings Technology*, 124 (2000), pp. 253–261.
R. Wiedemann et al., "Structure and Mechanical Properties of Amorphous Ti–B–N Coatings", *Surface and Coatings Technology*, 116–119 (1999), pp. 302–309.
R. Wiedemann et al., "Structure of Deposited and Annealed TiB₂ Layers", *Surface and Coatings Technology*, 97 (1997), pp. 313–321.
P. Losbichler et al., "Non–reactively sputtered TiN and TiB₂ films: influence of activation energy on film growth", *Surface and Coatings Technology*, 97 (1997), pp. 567–573.
M. Berger et al., "Low stress TiB₂ coatings with improved tribological properties", *Thin Solid Films*, 401 (2001), pp. 179–186.

* cited by examiner

*Primary Examiner*—Archene Turner
(74) *Attorney, Agent, or Firm*—Burns, Doane, Swecker & Mathis, L.L.P.

(57) ABSTRACT

The present invention relates to a cutting tool insert comprising a substrate and a coating including at least one layer of TiB₂. The TiB₂-layer has a fibrous microstructure where the grains are 5–50 nm, preferably 10–30 nm, in diameter and a length more than 250 mu, preferably more than 400 nm long, with a length to diameter ratio, l/d>2, preferably >5, and oriented essentially perpendicularly to the surface of the substrate.

13 Claims, 3 Drawing Sheets

COATED CUTTING TOOL

RELATED APPLICATION INFORMATION

This application is a divisional application of application Ser. No. 10/106,116, filed on Mar. 27, 2002, now U.S. Pat. No. 6,770,358 and claims priority under 35 U.S.C. §§119 and/or 365 to Application No. 0101111-3 filed in Sweden on Mar. 28, 2001, the entire contents of each of these documents is hereby incorporated by reference.

FIELD OF THE INVENTION

The present invention relates to a cutting tool for machining by chip removal comprising a substrate of cemented carbide, cermet, ceramics or high speed steel and a hard and wear resistant refractory coating. According to a preferred aspect, the coating is composed of one or more layers of refractory compounds of which at least one layer comprise a low compressive stress boride layer, e.g. $TiB_2$ or $ZrB_2$, preferably $TiB_2$ deposited by Physical Vapour Deposition (PVD). The $TiB_2$ and the rest of the layer(s), if any at all, are composed of metal nitrides and/or carbides and/or oxide with the metal elements chosen from Ti, Nb, Hf, V, Ta, Mo, Zr, Cr, W and Al.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Industrial use of PVD $TiB_2$ layers has so far been strongly limited due to the very high compressive stresses normally possessed by such layers. In recent years large efforts have been made to develop PVD processes for deposition of new ultra-hard thin layers, e.g. boron carbide ($B_4C$), titanium diboride ($TiB_2$) and cubic boron nitride (c-BN), for wear protection, especially of cutting tools. Although these layer materials are very attractive for the tooling industry, they have not yet become commercialized.

The high hardness and Young's modulus of $TiB_2$, as well as its chemical resistance, are attributed to the crystal structure and atomic bonding. In $TiB_2$ the Ti atoms form a metallic hexagonal structure. In analogy with the usual notation ABABAB for hexagonal close packing, the stacking sequence of Ti in $TiB_2$ will be AAA. The boron (B) atoms are situated interstitially between the A-layers forming a strong covalently bonded hexagonal net. The sequence may be described as AHAHAH where H denotes a boron layer. The combination of metallic Ti and strongly covalently bonded B results in a compound with high thermal and electrical conductivity as well as high yield strength and chemical resistance.

$TiB_2$ layers have been deposited by various PVD techniques, such as reactive sputtering, arc evaporation, and most commonly, magnetron sputtering. However, despite the very interesting properties of the $TiB_2$ bulk material, these layers are generally of little commercial interest. Their stress level is too high, which limits the practical adhesion, and thereby the layer thickness. In addition, due to the high intrinsic stressed layers are too brittle and easily fail because of lack of cohesion.

U.S. Pat. No. 4,019,873 discloses a coated cemented carbide cutting tool insert. The coating is composed of two superimposed layers including an outer, extremely wear-resistant layer consisting essentially of aluminium oxide and/or zirconium oxide. The inner layer is composed of at least one boride selected from the group consisting of borides of the elements titanium, zirconium, hafnium, vanadium, niobium, tantalum, chromium, molybdenum and tungsten.

U.S. Pat. No. 4,268,582 discloses a coated cemented carbide cutting tool insert comprising a cemented carbide substrate, the surface regions thereof having diffused therein an element such as boron, silicon or aluminium. The inserts further comprise a layer disposed on the diffused substrate, the layer being a boride such as titanium boride, hafnium boride, zirconium boride or tantalum boride. In another embodiment, the coated cemented article further includes an interlayer sandwiched between the diffused substrate and the boride layer.

Both these patents deposit the $TiB_2$-layers by CVD. However, because of the high temperature during CVD-deposition undesirable cobalt/boride-phases are formed. For that reason PVD deposition of $TiB_2$-layers on WC-Co based substrates is preferred.

M. Berger, M. Larsson and S. Hogmark, Surf. Coat. Technol., 124 (2000) 253–261 have grown $TiB_2$ layers with magnetron sputtering using negative substrate bias varying from −220V to −50 V, the residual stress were very high (i.e.—compressive stress from −10.2 GPa to −7.9 GPa). Also, one variant using 0 V was grown also resulting in a very high compressive residual stress of −6.1 GPa. In this investigation no films were grown using positive bias.

C. Mitterer, M. Rauter and P. Rodhamrnmer, Surf. Coat. Technol., 41 (1990) 351–363 have grown $TiB_2$ and Ti—B—N—C compound layers with magnetron sputtering using negative substrate bias. The $TiB_2$ layers were in high compressive residual stresses (~−4 GPa).

R. Wiedemann and H. Oettel, Surface Engineering, 14 4 (1998) 299–304 also have grown $TiB_2$ layers using magnetron sputtering. A negative substrate bias was used resulting in intrinsic compressive stress of ~−2 GPa. The hardness was low (25–29 GPa).

One possibility to obtain a low compressive residual stress state boride layer would be, for example, to grow at a high pressure, or other condition reducing ion bombardment. However, this will give a layer with a columnar structure, often associated with grain boundaries that lack density, and a cauliflower shaped surface morphology. This microstructure is not preferable since a typical application of $TiB_2$ layers are, for example, machining of soft and sticky aluminium alloys, which require the coating of the cutting tool to have a very smooth top surface in order to reduce the tendency to form a build-up edge. Of course, grain boundaries that are not dense are detrimental for the wear-resistance of the coating.

SUMMARY OF THE INVENTION

It is an object of the present invention to provide a $TiB_2$-coated cemented carbide cutting tool insert.

It is a further object of the present invention to provide a method for depositing $TiB_2$ layers with low compressive residual stresses. The low stress $TiB_2$ layer should possess a dense, fibrous microstructure, and a smooth top-surface.

According to a first aspect, the present invention provides a cutting tool insert comprising a substrate and a coating, the coating comprising at least one layer of $TiB_2$ having a fibrous microstructure wherein the (e.g.—cylindrical) grains are 5–50 nm (in diameter), an average of approximately 15 nm in diameter, and more than 250 nm long, with a length to diameter ratio l/d>2, and the fibrous grains are oriented essentially perpendicularly to a surface of the substrate.

According to a second aspect, the present invention provides a method of making a cutting tool insert comprising a substrate and a coating including at least one layer of $TiB_2$ having a fibrous microstructure by PVD magnetron sputtering, the method compromising utilizing a bias voltage, $V_s>0$ V.

DETAILED DESCRIPTION OF THE INVENTION

In the following description the residual stress state, $\sigma_{tot}$, denote the total stress of a coating on the actual substrate, i.e.—the sum of the thermal stresses, $\sigma_{thermal}$, due to difference in coefficient of thermal expansion between the substrate and the coating material, and the intrinsic stresses, $\sigma_{int}$, originating from the actual growth process, i.e.—$\sigma_{tot}=\sigma_{thermal}+\sigma_{int}$.

Figure 1:
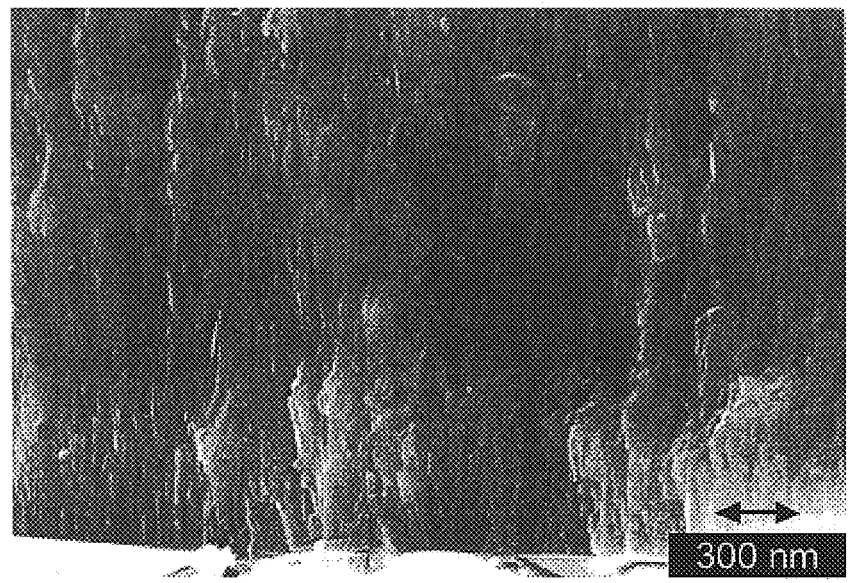
FIG. 1 is a photomicrograph of a cross-section of a relatively thin refractory layer formed according to the present invention.
Figure 2:
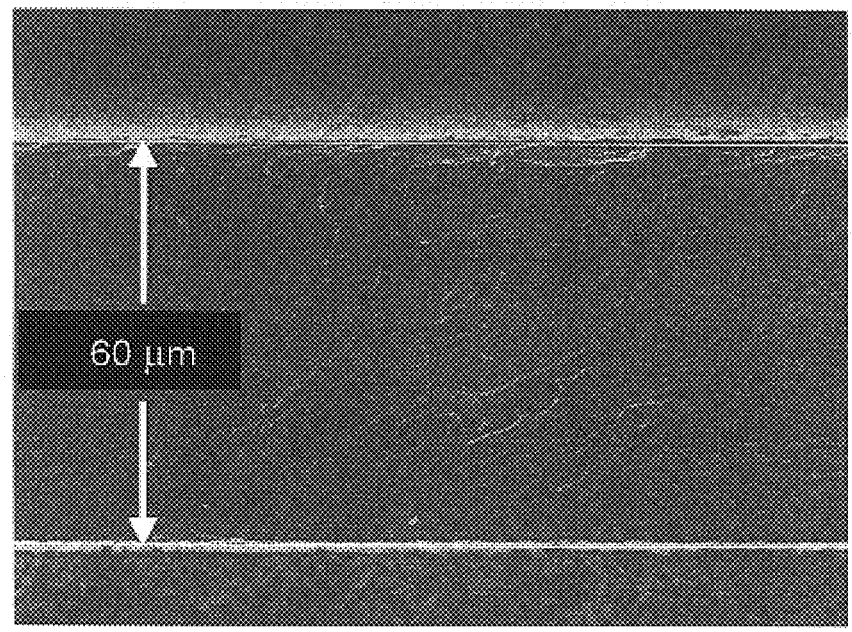
FIG. 2 is a photomicrograph of a cross-section of a relatively thick refractory layer formed according to the present invention.
Figure 3:
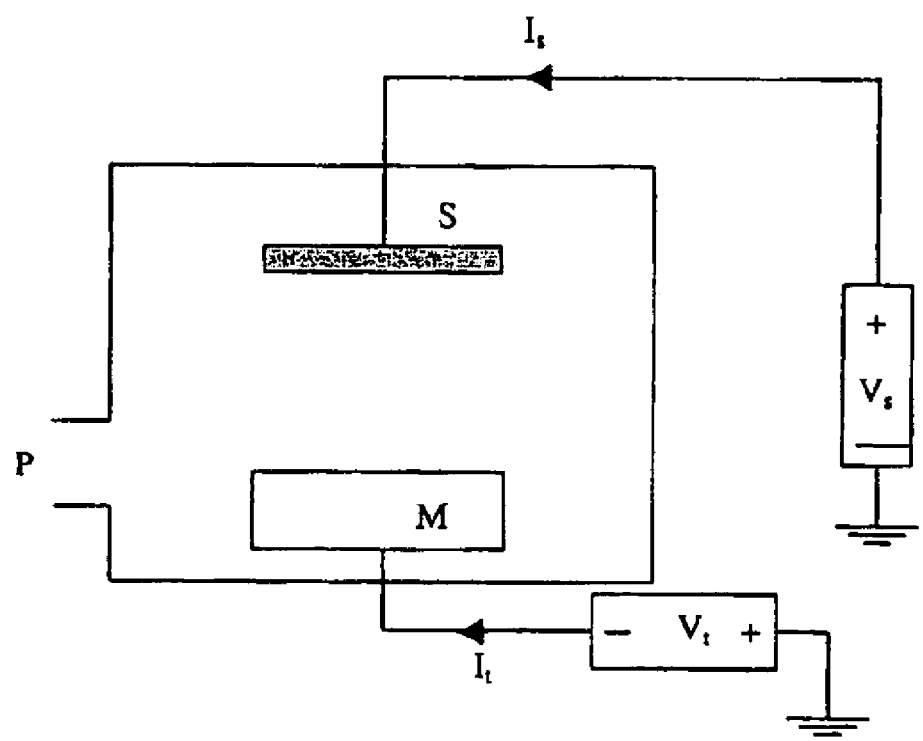
FIG. 3 is a schematic illustration of a magnetron sputtering device utilized in association with the present invention.
Figure 4:
FIG. 4 is a TEM micrograph of a relatively thin layer formed according to the principles of the present invention.

FIG. 1 shows the microstructure, in cross-section, of a relatively thin layer of $TiB_2$-layer (4 μm), according to the present invention. FIG. 2 is a corresponding picture of a thick layer (60 μm). FIG. 3 schematically shows the used magnetron sputtering equipment. FIG. 4 shows a TEM micrograph layer of a thin layer (4 μm).

In these figures S=substrate, P=pumping unit, M=magnetron, sputtering source, $V_s$=substrate potential (bias), $I_s$=substrate current, $V_t$=target potential, $I_t$=target current.

According to the present invention there is provided a cutting tool for machining by chip removal of materials such as non-ferrous material such as aluminium alloys. The cutting tool comprises a body of a hard alloy of cemented carbide, cermet, ceramics or high speed steel onto which a hard and wear resistant refractory coating is deposited. The wear resistant coating is composed of one or more layers of refractory compounds of which at least one layer, preferably the outermost layer, is composed of $TiB_2$, and that the innermost layer(s), if any at all, between the tool body and the $TiB_2$-layer, is composed of metal nitrides and/or carbides and/or oxides with the metal elements selected from Ti, Nb, Hf, V, Ta, Mo, Zr, Cr, W and Al. The $TiB_2$-layers are a dense, crystalline $TiB_2$ free of cracks with a fine-grained fibrous morphology described below.

The fine-grained fibrous $TiB_2$-layer can also be deposited directly onto a cutting tool substrate of cemented carbide, cermet, ceramics or high speed steel. The thickness of the $TiB_2$ layer(s) varies from 0.5 to 60 μm preferably from 1 to 15 μm, for metal machining. The total coating thickness according to the present invention varies from 0.5 to 60 μm, preferably from 1 to 20 μm, with the thickness of the non-$TiB_2$-layer(s) varying from 0.1 to 15 μm. Further, layers of metal nitrides and/or carbides and/or oxide with the metal elements selected from Ti, Nb, Hf, V, Ta, Mo, Zr, Cr, W and Al can be deposited on top of the $TiB_2$-layer.

In an alternative embodiment, a process according to the present invention can be used to deposit layers thicker than 50 μm with retained mechanical properties and adhesion to the substrate, due to the capability of the process capability to grow layers free of intrinsic stress.

In another alternative embodiment, thin layers (0.2–3 μm) with an increased effective adhesion can be deposited.

In a preferred embodiment the $TiB_2$-layer is the outermost layer and with an average surface roughness $R_a$ of not more than 50 nm.

This invention refers specially to a layer consisting of a fibrous morphology. PVD layers typically have a columnar morphology, i.e.—some grains have a tendency to increase in diameter on behalf of other grains. However, the $TiB_2$ layer according to present invention are grown in a mode where the fibrous morphology are kept almost unaffected from a layer thickness of 0.2 μm up to more than 60 μm. This morphology is in most cases preferable if a high cohesive strength of the grain boundaries are achieved. This is probably because of the small grain size in the direction abrasive wear, and large grain size in the direction of the applied compressive stress originating from the machining operation, giving a tougher coating material. FIG. 1 shows a fracture cross-section of a relatively thin layer (4 μm) and FIG. 2 shows a thick layer (60 μm). It is clearly evident that the morphology is almost unaffected by the layer thickness. FIG. 4 shows a TEM micrograph layer of a thin layer (4 μm), that after the first fine grained nucleation zone, about 100 nm thick, the fibrous morphology develops. The grains are typically 5–50 nm in diameter, preferably 10–30 nm in average, ~15 nm in diameter, and a length more than 250 nm, preferably more than 400 nm. The fibrous grains may be generally cylindrical in shape. The fibrous grains have a length to diameter ratio, l/d>2, preferably >5, and d varies little over the main length of the grains. The fibers are oriented perpendicularly to the surface of the substrate.

The fine-grained, fibrous crystalline $TiB_2$ according to the invention is strongly textured in the [001]-direction, a texture coefficient, TC, can be defined as.

$$TC(hkl) = \frac{I(hkl)}{I_0(hkl)} \left[ \frac{1}{n} \sum_{1}^{n} \frac{I(hkl)}{I_0(hkl)} \right]^{-1}$$

where

I(hkl)=measured intensity of the (hkl) reflection $I_O$(hkl)=standard intensity from the ASTM standard powder pattern diffraction data (JCPDS 35-0741)

n=number of reflections used in the calculation (in this case 8)

(hkl) reflections used are: (001), (100), (101), (110) (102+111), (201), (112) and (103+210). Where e.g. (103+210) means that those two, very close reflections, are treated as one reflection having the sum of intensity of the two. According to the present invention, the TC for the set of (001) crystal planes is greater than 5, preferably greater than 6.5.

In addition, $TiB_2$-layers according to the present invention exhibit a residual stress state of $\sigma_{tot}<0$ GPa but larger than −1 GPa, preferably −0.5 GPa, when deposited on WC-6 wt % Co substrate. This corresponds to an intrinsic stress state, $\sigma_{int}$, close to zero. The thermal stresses, $\sigma_{thermal}$, can be calculated using $$\sigma_{thermal} = \frac{E_f}{(1-v_f)} \cdot (\alpha_f - \alpha_{sub}) \cdot (T_{dep} - T_{ana})$$

where $E_f$ and $v_f$ are the Young's modulus and Poisson's ratio of the film, respectively. $\alpha_f$ and $\alpha_{sub}$ the coefficient of thermal expansion of the film and substrate material. $T_{dep}$ and $T_{ana}$ the deposition and analyse temperature in K. It is important to do the estimate of the thermal stresses by using the thermal expansion in the a-direction of the $TiB_2$ lattice, since due to the (001) texture almost all grains are oriented so that direction is parallel to the substrate surface. Using $\alpha_{sub}=4.8*10^{-6}$, $\alpha_{TiB2,a}=3.56*10^{-6}$, $E_f=600$ GPa, $v_f=0.22$, $T_{dep}=773$ K, $T_{ana}=273$ K in the equation above gives $\sigma_{thermal}=-0.5$ GPa.

The residual stress, $\sigma_{tot}$, is determined using the well-known beam deflection technique.

The intrinsic stress can then be obtained by applying the equation:

$$\sigma_{int}=\sigma_{tot}-\sigma_{thermal}$$

The intrinsic stress, $\sigma_{int}$, of coatings deposited with positive bias is therefore:

$\sigma_{int}=-0.5-(-0.5)=0$ GPa, i.e.—those coatings are grown in a stress free mode.

According to the method of the present invention $TiB_2$ layers with low compressive residual stresses are deposited by magnetron sputtering of a $TiB_2$ target under the following conditions:

Magnetron power: 3–20 kW
Substrate current $I_s$: −1−−15 A
Atmosphere: Ar
Pressure: $<10^{-2}$ mbar, preferably $<10^{-3}$ mbar
Bias voltage $V_s$: >0 preferably >+5 V but <+60 V. The substrate current $I_s$ changes polarity because of the positive $V_s$. This corresponds to low energetic ion bombardment and electron bombardment of the growing layer surface.

Layers deposited with the standard technology using negative $V_s$ have a columnar structure. Here "columnar structure" describes a layer morphology where the grains, after the initially nucleation zone, have conical shape some with increasing diameter (in the plane parallel to the substrate surface), and other grains with decreasing diameter. This mode of growth is controlled by competition between different grains, where some grow out from others.

On the other hand, layers deposited with positive bias according to this invention consist of a fibrous morphology. No elements other than Ti, B, and small impurities of Ar are found in the layers, indicating that no sputtering from chamber walls occurs although the plasma potential probably is high when applying a positive potential.

While not intending to limit the invention to any particular theory, it is believed that the low stress level of layers according to the present invention is due to a combination of three effects: first, increased bulk temperature and adatom mobility; secondly, minimisation of energetic ion bombardment during growth; and thirdly, an electron bombardment of the surface enhancing surface mobility and increasing the nucleation rates. Also, is it likely that the electron current increases the desorption rate of absorbed hydrogen and/or water molecules from the surface. All this together result in drastically reduced residual stress compared to layers grown with negative substrate bias.

The residual stress state of layers grown according to present invention are almost free of intrinsic stress, i.e.—the slightly compressive stress state measured originate only from the difference in coefficient of thermal expansion between the substrate and the layer.

The present invention has been described with reference to $TiB_2$-layers. It is obvious that the method can also be applied to the deposition of other wear resistant material where high compressive stresses is a problem such as $ZrB_2$-layers or other borides.

EXAMPLE 1

$TiB_2$-layers were deposited in a commercially available deposition system aimed for thin film deposition equipped with a dc magnetron sputter source with a $TiB_2$ target (12.5×25.5 cm$^2$).

Mirror-polished cemented carbide substrates with composition 6 wt % Co and 94 wt % WC were used. The WC grain size was about 1 μm and the hardness was 1650 $HV_{10}$.

Before deposition, the substrates were cleaned in an ultrasonic bath of an alkali solution and in alcohol. The substrates were stationarily positioned 5 cm above the magnetron and resistively heated by an electron beam for 50 min to about 450° C. Immediately after heating, the substrates were argon-ion etched (ion current density 5.4 mA/cm$^2$) for 30 minutes using a substrate bias of −200V. The subsequent $TiB_2$ deposition was carried out at the following seven different bias voltages, $V_s$; −200V, −110V, +10V, +25V, +35V and +50V. A magnetron power of 6 kW, resulting in a target potential of about 500V and an Ar pressure of 3×10$^{-3}$ mbar were maintained during deposition of all layers. The resulting thickness of the positively biased layers was ~4 μm. The negatively biased layers were made somewhat thinner (~3 μm) to avoid layer failure due to their higher residual stresses. The substrate temperature was measured with a thermocouple attached to the substrate holder.

The substrate current $I_s$ was +1.2 A for negative $V_s$, irrespective of voltage. When changing from negative to positive $V_s$ the substrate current changed sign from positive to negative. The current was also found to increase with increasing positive $V_s$ up to +25V whereafter it started to level of around 13 A for further $V_s$ increase.

Using a positive $V_s$ resulted in a substrate temperature at the end of deposition $T_{dep}$ increase to about 200° C. higher than using negative $V_s$. However, the different positive or negative $V_s$ did not significantly influence $T_{dep}$.

XRD analysis showed that all films exhibited the hexagonal hcp-$TiB_2$ phase with a strong (001) texture with a texture coefficient as defined above of 6.5 or more, i.e.—no other diffraction peaks where detected. The FWHM values of the (001) peak showed that the positively biased layers gave sharper peaks than those formed with negative $V_s$. No influence was seen on FWHM within the positive range of $V_s$, while for negative $V_s$, FHWM increased with the voltage.

SEM studies of fracture cross-sections revealed columnar structure for layers deposited with negative $V_s$. It was more pronounced for −200V than for −110V. For positive $V_s$, no columnar growth was observed. However, in higher magnification, a dense, fibrous morphology was observed on positively biased layers see FIG. 1. EDS analysis indicated that all layers were slightly overstoichiometric in B. The Ti/B ratio was typically 0.46 for all layers independent of $V_s$. Layers grown with negative $V_s$ contained as much as 8 at % Ar for $V_s=-200V$, while when using positive $V_s$ no Ar could be detected. No other elements than Ti, B and Ar could be found in any layer.

By applying a positive $V_s$, independent of value, layers with low compressive residual stress states, i.e.—$\sigma_{tot}\approx-0.5$ GPa, were obtained. This stress state corresponds roughly to the thermal stress state. On the other hand, using negative $V_s$ gave layers with residual stresses in the range of −7 to −10 GPa.

All layers exhibited H and E values of about 50 and 600 GPa (measured with nanoindentation technique), respectively.

The abrasive wear rate was about 25–30 $\mu m^3$/mmN for all layers, except the one grown with $V_s=-200V$ which showed about 50% higher wear rate than the other.

From a scratch test it was concluded that the adhesion was good for all layers, and in all cases the initial layer failure was of a cohesive type. There was no significant difference in critical load $F_{N,C}$ among the layers deposited with positive bias. They were all in the 42–46 N range. The layers deposited with negative $V_s$ displayed a lower $F_{N,C}$, about 25–30 N, and also a higher amount of cohesive failures at the rim of the scratch, than layers deposited with positive $V_s$. Though, the scratch test demonstrate that coatings according to present invention have strongly enhanced toughness properties compared with coatings grown using negative bias.

The surface roughnesses, Ra, were measured with a interferometric method using a Wyco MD-2000 instrument. Of course will Ra of the coating be influenced by the surface roughness of the substrate for thin coatings, as in this example, here was Ra of the substrate ~5 nm. i.e.—the increase in Ra after deposition (~5 nm to ~20 nm) is extremely small.

It is obvious that the surface roughness decreases when changing the substrate bias, $V_s$, from negative to positive see table 1. However, no significant difference between different coatings grown with different positive bias could be seen.

TABLE 1

Bias voltage and properties of the $TiB_2$ layers.

| $V_s$ [V] | FWHM (001) [2θ] | σ [GPa] | H [Gpa] | E [GPa] | $F_{N,C}$ [N] | Wear rate [$\mu m^3$/mN] | Ra [nm] | Structure |
|---|---|---|---|---|---|---|---|---|
| −200 V | 0.495 | 10.5 ± 0.8 | 50 ± 5 | 605 ± 70 | 29 ± 1 | 61 ± 7 | 75 | Columnar |
| −110 V | 0.453 | 7.1 ± 0.6 | 52 ± 3 | 600 ± 65 | 25 ± 1 | 32 ± 5 | 60 | Columnar |
| +10 V | 0.287 | 0.5 ± 0.2 | 48 ± 4 | 580 ± 70 | 45 ± 1 | 26 ± 6 | 22 | Fibrous |
| +25 V | 0.304 | 0.3 ± 0.2 | 49 ± 7 | 560 ± 95 | 43 ± 1 | 36 ± 8 | 18 | Fibrous |
| +35 V | 0.286 | 0.7 ± 0.2 | 53 ± 7 | 640 ± 50 | 46 ± 3 | 32 ± 7 | 20 | Fibrous |
| +50 V | 0.290 | 0.5 ± 0.2 | 54 ± 9 | 600 ± 85 | 42 ± 1 | 25 ± 3 | 15 | Fibrous |

EXAMPLE 2

Cemented carbide cutting tool inserts, solid exchangeable end mill MM16-20020-B120 PF-M04 (WC-6 wt % Co) type were coated with a 30 $\mu m$ thick layer of $TiB_2$ according to example 1 using a bias, $V_s$, of +50 V. The coated milling cutters were tested versus an uncoated variant of the same tool, in a copying milling operation of graphite, at 4000–6000 rpm, feed 700 mm/min

| Variant | Tool life, h | Failure mode |
|---|---|---|
| Uncoated | 10 | Flank wear, Vbmax 0.3 mm |
| $TiB_2$ coated | 40 | Not end of tool life, Vbmax 0.1 mm |

EXAMPLE 3

Inserts coated with $TiB_2$ according to example 1 were tested. Coating of TiN (prior art) were compared with two different $TiB_2$ coated variants, deposited using $V_s$ of −110 V and +50 V, respectively. Also an uncoated variant was tested. The cemented carbide insert had a polished rake face prior to coating. The edge hone was sharp. The carbide had a composition of 6.0 wt-% Co, 0.5 wt-% TaC/NbC, balance WC. The coating of the insert consisted of TiN or $TiB_2$ with a total thickness of 3.0–4.0 $\mu m$.

| Operation: | Square shoulder milling |
|---|---|
| Work piece: | Plate |
| Material: | AA7075 |
| Insert type: | APEX160408FR-E08 |
| Cutting speed: | 800 m/min |
| Feed: | 0.2 mm/rev |
| Depth of cut: | 6.0–10.0 mm |
| Remarks: | dry milling |

| Variant | Time at first formation of build-up edge(h) | Degree of build-up edge | Flank wear Vbmax (mm) |
|---|---|---|---|
| Uncoated | 2.3 | Heavy | 0.18 |
| TiN | 1.1 | Heavy | 0.11 |
| $TiB_2$ ($V_s$ = −110 V) | 3.8 | Small | 0.05 |
| $TiB_2$ ($V_s$ = +50 V) | 6.2 | None | Not measurable |

EXAMPLE 4

A similar procedure to example 3 was utilized but using a lower cutting speed in order to promote build-up edge formation.

| Operation: | Square shoulder milling |
|---|---|
| Work piece: | Plate |
| Material: | AA7075 |
| Insert type: | APEX160408FR-E08 |
| Cutting speed: | 650 m/min |
| Feed: | 0.2 mm/rev |
| Depth of cut: | 6.0–10.0 mm |
| Remarks: | dry milling |

| Variant | Time at first formation of build-up edge (h) | Degree of build-up edge | Flank wear Vbmax (mm) |
| --- | --- | --- | --- |
| Uncoated | 0.5 | Very Heavy | 0.21 |
| TiN | Immediate | Very Heavy | 0.18 |
| TiB$_2$ (V$_s$ = −110 V) | 4.0 | Heavy | 0.08 |
| TiB$_2$ (V$_s$ = +50 V) | 6.5 | Small | Not measurable |

We claim:

1. A method of making a cutting tool insert comprising a substrate and a coating including at least one layer of TiB$_2$ having a fibrous microstructure by PVD magnetron sputtering, the method comprising utilizing a bias voltage of +5V to +60V.

2. The method of claim 1, wherein the fibrous microstructure includes grains having an average diameter of 5 to 50 nm, a length more than 250 nm, and a length to diameter ratio greater than 2.

3. The method of claim 2, wherein the average diameter is approximately 10 to 30 nm.

4. The method of claim 3, wherein the average diameter is approximately 15 nm.

5. The method of claim 2, wherein the grains are oriented essentially perpendicular to a surface of the substrate.

6. The method of claim 1, wherein a thickness of the at least one layer of TiB$_2$ is from 0.5 μm to 60 μm.

7. The method of claim 6, wherein the thickness is from 1 μm to 15 μm.

8. The method of claim 1, wherein a total thickness of the coating is from 0.5 μm to 60 μm and the coating includes a TiB$_2$-layer having a thickness from 0.1 μm to 15 μm.

9. The method of claim 8, wherein the total thickness of the coating is from 1 μm to 20 μm.

10. The method of claim 1, comprising coating a top layer on the at least one layer of TiB$_2$, the top layer of metal nitrides and/or carbides and/or oxides of a metal element selected from Ti, Nb, Hf, V, Ta, Mo, Zr, Cr, W and Al.

11. The method of claim 1, wherein the at least one layer of TiB$_2$ is an outermost layer having a surface roughness of not more than 50 nm.

12. The method of claim 1, having a texture coefficient for a set of (001) crystal planes >5, wherein the texture coefficient is defined as:

$$TC(hkl) = \frac{I(hkl)}{I_0(hkl)} \left[ \frac{1}{n} \sum_1^n \frac{I(hkl)}{I_0(hkl)} \right]^{-1}$$

where

I(hkl)=measured intensity of the (hkl) reflection

I$_O$(hkl)=standard intensity from the ASTM standard powder pattern diffraction data (JCPDS 35-0741)

n=number of reflections used in calculation (hkl) reflections used are: (001), (100);(101), (110) (102+111), (201), (112) and (103+210), where (103+210) means the (103) and (210) reflections are treated as one reflection having a sum of intensity of the two reflections.

13. The method of claim 1, wherein the substrate comprises 6 wt-% Co and WC and wherein a residual stress state in the at least one layer of TiB$_2$ is less than 0 GPa but greater than −1 GPa.

* * * * *